United States Patent
Kimura et al.

(10) Patent No.: US 6,942,506 B2
(45) Date of Patent: Sep. 13, 2005

(54) CARD CONNECTOR HAVING A HEAT RADIATION MEMBER WITHOUT INHIBITING INSERTION AND REMOVAL OF A CARD

(75) Inventors: Akira Kimura, Tokyo (JP); Takamitsu Wada, Saitama (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 10/946,182

(22) Filed: Sep. 21, 2004

(65) Prior Publication Data

US 2005/0074995 A1 Apr. 7, 2005

(30) Foreign Application Priority Data

Oct. 2, 2003 (JP) .................................... 2003-344832

(51) Int. Cl.[7] .............................................. H01R 13/62
(52) U.S. Cl. ...................... 439/159; 439/487; 174/16.3
(58) Field of Search ............................... 439/485, 487, 439/159, 160; 174/16.3

(56) References Cited

U.S. PATENT DOCUMENTS

| | | | | |
|---|---|---|---|---|
| 5,865,639 A | * | 2/1999 | Fuchigami et al. | ......... 439/487 |
| 6,071,149 A | * | 6/2000 | Hara | ........................... 439/159 |
| 6,201,697 B1 | * | 3/2001 | McCullough | .............. 174/16.3 |
| 6,278,609 B1 | * | 8/2001 | Suzuki et al. | ............... 361/704 |
| 6,749,448 B2 | * | 6/2004 | Bright et al. | ............... 439/160 |
| 2003/0032322 A1 | * | 2/2003 | Nakamura et al. | .......... 439/487 |

FOREIGN PATENT DOCUMENTS

| | | | | |
|---|---|---|---|---|
| JP | 403188589 A | * | 8/1991 | ................. 235/487 |
| JP | 266081 | | 9/2001 | |

* cited by examiner

*Primary Examiner*—Tho D. Ta
(74) *Attorney, Agent, or Firm*—Collard & Roe, P.C.

(57) ABSTRACT

In a card connector having an eject mechanism for removing a card inserted at a predetermined position, the card connector has a heat radiation member which is brought into contact with the card to promote heat radiation. The heat radiation member is held by holding members to be movable with respect to the card. The card connector further has cam mechanisms acting between the holding members and eject mechanisms for removing the card. When the card is removed from the predetermined position, the card is removed after the heat radiation member is separated from the card.

13 Claims, 8 Drawing Sheets

CARD CONNECTOR HAVING A HEAT RADIATION MEMBER WITHOUT INHIBITING INSERTION AND REMOVAL OF A CARD

This application claims priority to prior Japanese patent application JP 2003-344832, the disclosure of which is incorporated herein by reference.

BACKGROUND OF THE INVENTION

This invention relates to a connector for use in connecting each of card-like electronic parts (hereinafter simply called a "card") used in a POD (point of deployment) module or the like. The connector will be called hereinafter a card connector.

For example, such a POD module is used in an apparatus for receiving digital cable television broadcasting. The apparatus will be called hereinafter a television (TV). The POD module is connected with a card recording personal data of a TV viewer. With reference to the personal data recorded in the card, a TV station judges whether or not reception is to be permitted to the TV viewer.

The module of the type is continuously energized and may be elevated in temperature to about 60° C. On the other hand, the card used in the POD module includes a semiconductor device, such as an IC. Therefore, temperature elevation must be minimized. Necessity of cooling in a typical IC card is described, for example, in Japanese Patent Application Publication (JP-A) No. 2001-266081.

SUMMARY OF THE INVENTION

It is therefore an object of the present invention to provide a card connector having a mechanism for promoting heat radiation without inhibiting insertion and removal of a card.

Other objects of the present invention will become clear as the description proceeds.

According to an aspect of the present invention, there is provided a card connector to be connected to a card inserted at a predetermined position, the card connector comprising an eject mechanism for removing the card, a heat radiation member for promoting heat radiation of the card, a holding member holding the heat radiation member so that the heat radiation member is movable with respect to the card, and a cam mechanism acting between the eject mechanism and the holding member, the heat radiation member being brought into contact with the card when the card is inserted to the predetermined position, the card being removed from the predetermined position after the heat radiation member is separated from the card by the action of the cam mechanism.

DESCRIPTION OF THE PREFERRED EMBODIMENT

Referring to FIGS. 1 through 7, a card connector according to one embodiment of this invention will be described.

The card connector illustrated in the figure is adapted to be connected to a card 12 inserted to a predetermined position of a base plate 11. The card connector has a card guide 14 fixed to an upper surface 13 of the base plate 11 to guide insertion and removal of the card 12 in a first direction A1. On the upper surface 13 of the base plate 11, a connector element 15 such as a pin connector is fixed at a position corresponding to one end, i.e., a rear end of the card guide 14 in the first direction A1. A cable 16 such as a FPC is connected to the connector element 15 and extracted rearward. The card 12 may be a card-like electronic element which is adapted to be used in a POD module or the like and which records personal data of a TV viewer.

The base plate 11 has a rear end provided with a pair of fitting lugs 17 bent from its side edges above the upper surface 13 and faced to each other in a second direction A2 perpendicular to the first direction A1. The fitting lugs 17 have a pair of through holes 18 faced to each other in the second direction A2, respectively.

The card connector illustrated in the figure further includes a generally U-shaped arm 21, a first shaft 22 for fixing the arm 21 to the base plate 11, a heat sink 23 as a heat radiation member, a second shaft 24 for fixing the heat sink 23 to the arm 21, and a spring 25, such as a torsion coil spring, serving as urging means. The arm 21 has a pair of through holes 26 formed on its one end and faced to each other.

In the state where the first through holes 26 of the arm 21, the through holes 18 of the fitting lugs 17, and an inner bore of the spring 25 are aligned, the first shaft 22 is inserted through the first through holes 26, the through holes 18, and the inner bore. Further, one end and the other end of the spring 25 are engaged with the base plate 11 and the arm 21, respectively. Thus, the arm 21 is fixed to the base plate 11 in a manner such that the arm 21 is rotatable around the first shaft 22 and a rotating end of the arm 21 is urged by the spring 25 towards the base plate 11.

The arm 21 further has a pair of second through holes 27 formed at its intermediate portion. On the other hand, the heat sink 23 has a pair of through holes 28 corresponding to the second through holes 27. In the state where the second through holes 27 of the arm 21 and the through holes 28 of the heat sink 23 are aligned, the second shaft 24 is inserted through the second through holes 27 and the through holes 28. Thus, the heat sink 23 is held by the arm 21 to be rotatable around the second shaft 24 extending in the second direction A2. A combination of the arm 21 and the second shaft 24 forms a holding member holding the heat sink 23 so that the heat sink 23 is movable with respect to the card 12.

In this embodiment, the second shaft 24 of a pin-like shape is used to rotate the heat sink 23. Alternatively, the second shaft may have a plate-like shape. In this case, the second shaft itself is elastically deformed so as to rotate the heat sink within a predetermined angular range.

The rotating end of the arm 21 is urged by the spring 25 towards the base plate 11. Therefore, when the card 12 is inserted at the predetermined position, the heat sink 23 is contacted with an upper surface of the card 12 and serves to promote or facilitate heat radiation or heat dissipation of the card 12. The heat sink 23 has a number of radiation fins 29 formed on its upper surface so as to enhance a heat radiation effect.

The card connector illustrated in the figure further includes an eject bar 31 disposed on one side of the card guide 14 in the second direction A2, and a lever 32 disposed on a rear side of the card guide 14. The eject bar 31 is slidable along the card guide 14 in the first direction A1 and has a protrusion 34 formed at a part of its upper surface and defining a cam surface. The lever 32 is attached to the card guide 14 or the base plate 11 to be rotatable around a support point 35. The lever 32 has a first end 36 engaged with a rear end of the eject bar 31 in the first direction A1 and a second end 37 engaged with the card 12 in the first direction A1. A combination of the eject bar 31 and the lever 32 forms an eject mechanism for removing the card 12.

The protrusion 34 is formed at a position where the cam surface 34 is engaged with or disengaged from the second shaft 24 following a sliding movement of the eject bar 31. In the middle of a rearward sliding movement of the eject bar 31, the cam surface 34 is engaged with the second shaft 24 to gradually lift the second shaft 24. In other words, the second shaft 24 climbs over an upper surface of the protrusion 34. In the middle of a forward sliding movement of the eject bar 31, the second shaft 24 is gradually lowered along the cam surface 34 under restoring force of the spring 25 and, thereafter, the cam surface 34 is disengaged from the second shaft 24. Thus, the second shaft 24 serves as a cam follower following the cam surface 34. The second shaft 24 and the cam surface 34 cooperatively form a cam mechanism.

Next, description will be made of an operation of the card connector illustrated in the figure.

Figure 1:
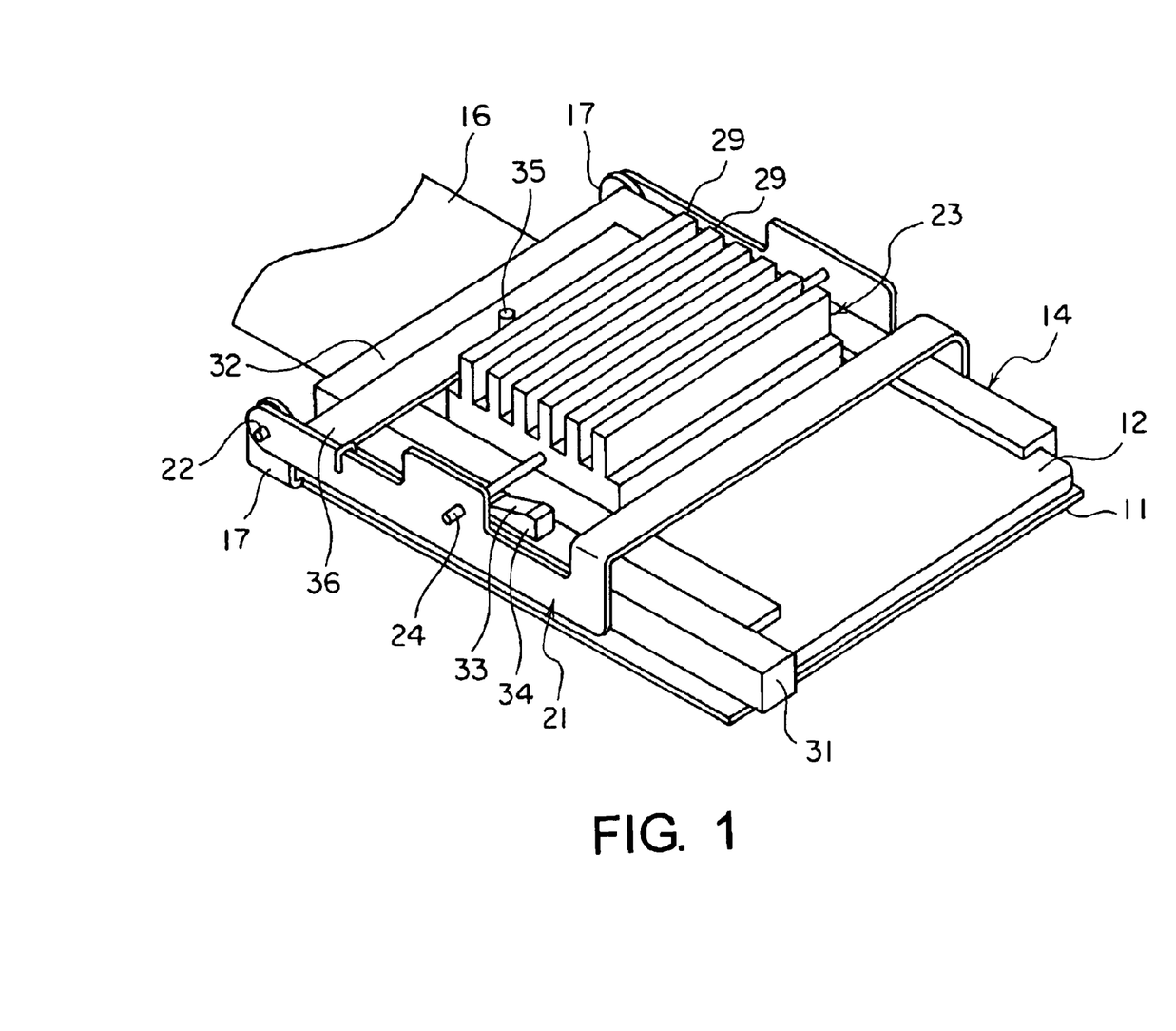
FIG. 1 is a perspective view of a card connector according to one embodiment of the present invention, wherein a card is connected to the card connector.
Figure 2:
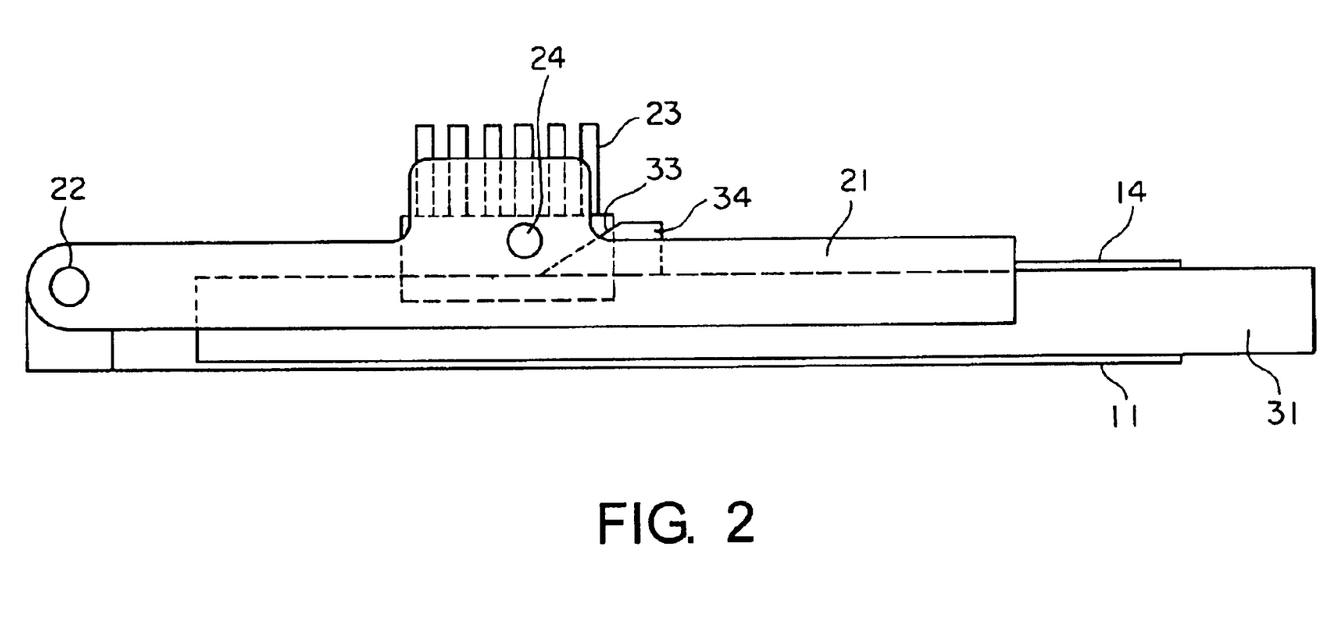
FIG. 2 is an enlarged side view of the card connector in the state of FIG. 1.
Figure 3:
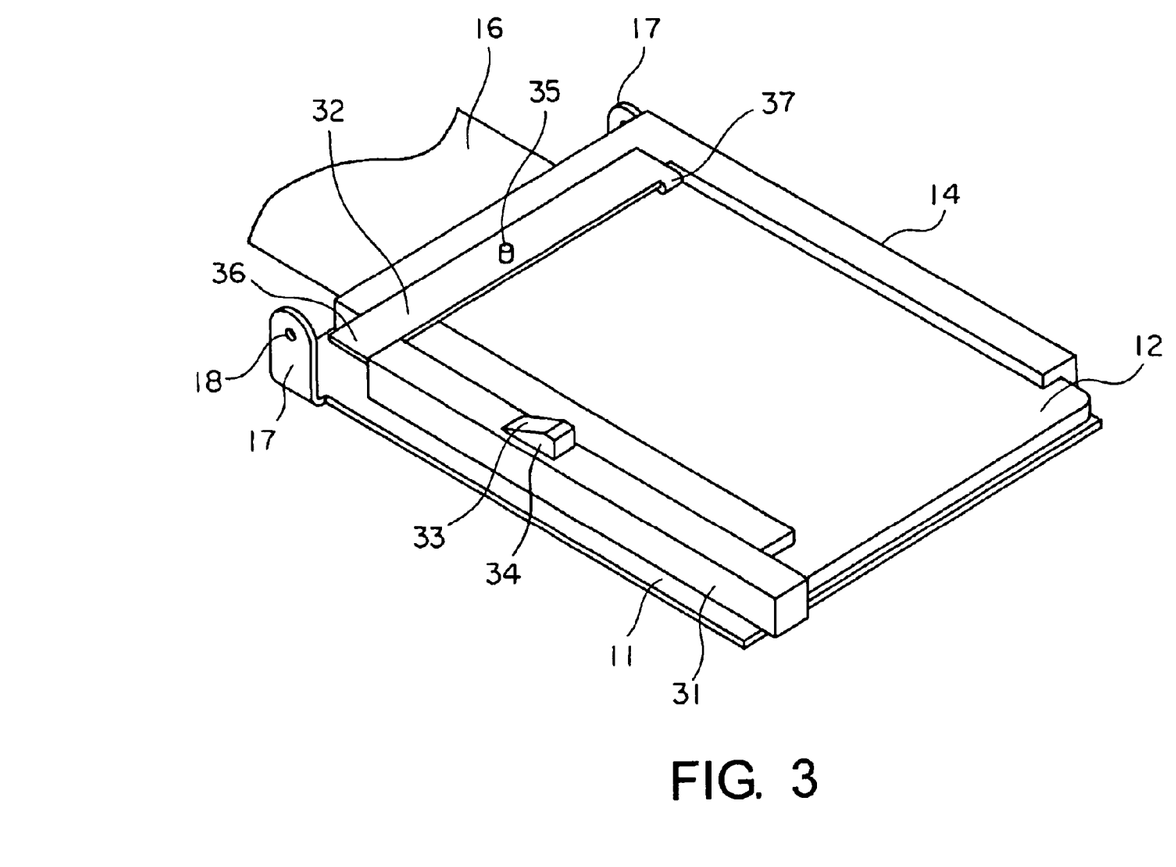
FIG. 3 is a perspective view of the card connector in the state of FIG. 1 with some components omitted in order to clearly show an internal state.

When the card 12 is inserted to the predetermined position, the second end 37 is pushed by a rear end of the card 12 to rotate the lever 32 around the support point 35 in a counterclockwise direction. At this time, the first end 36 of the lever 32 presses and moves the eject bar 31 forward. In this state, the cam surface 34 is separated from the second shaft 24. Therefore, the heat sink 3 is brought into contact with the upper surface of the card 12 by its weight and urging force of the spring 25. As a consequence, heat radiation of the card 12 is promoted by the heat sink 23.

Figure 4:
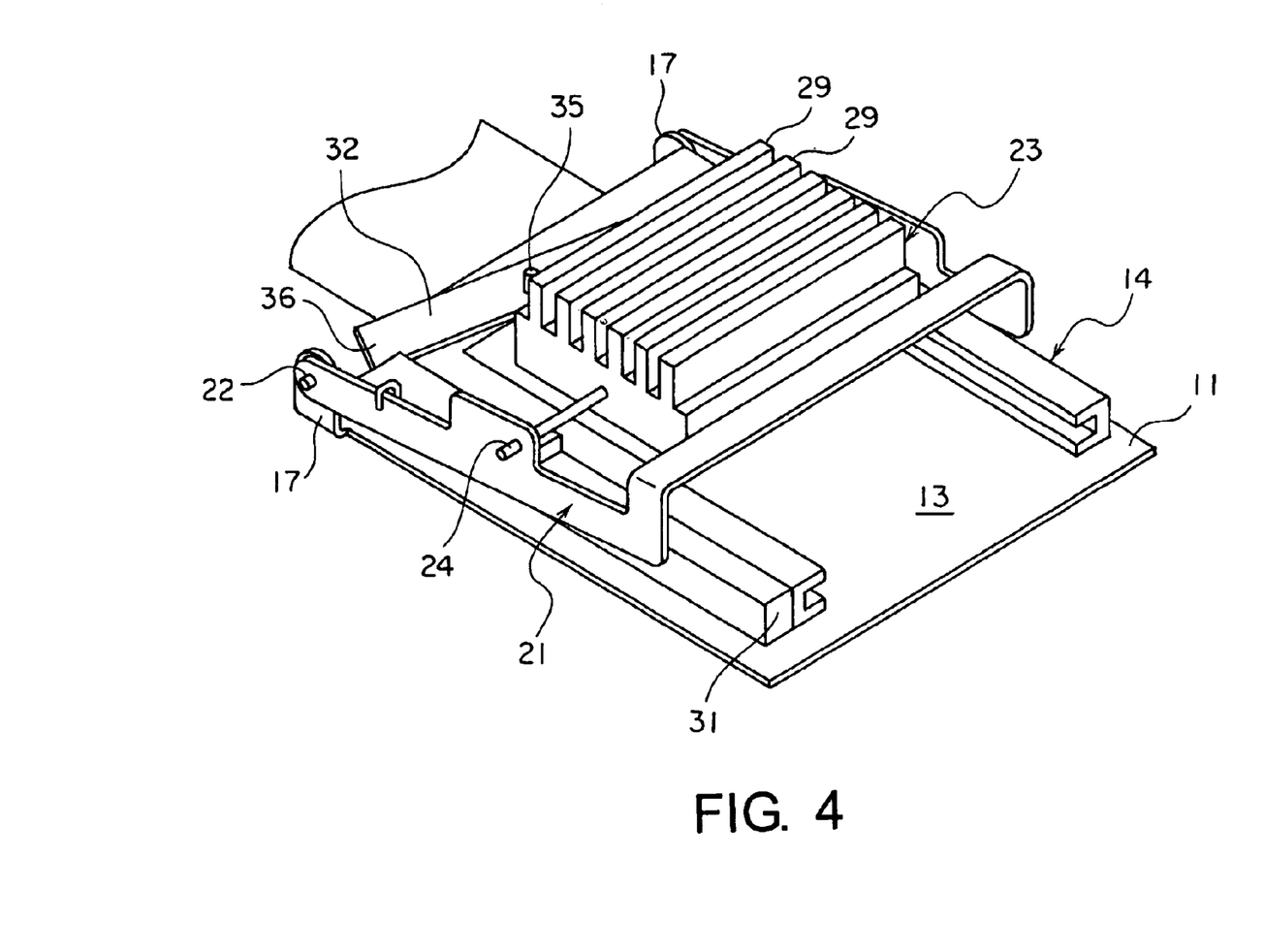
FIG. 4 is a perspective view of the card connector illustrated in FIG. 1, wherein the card is not connected to the card connector.
Figure 5:
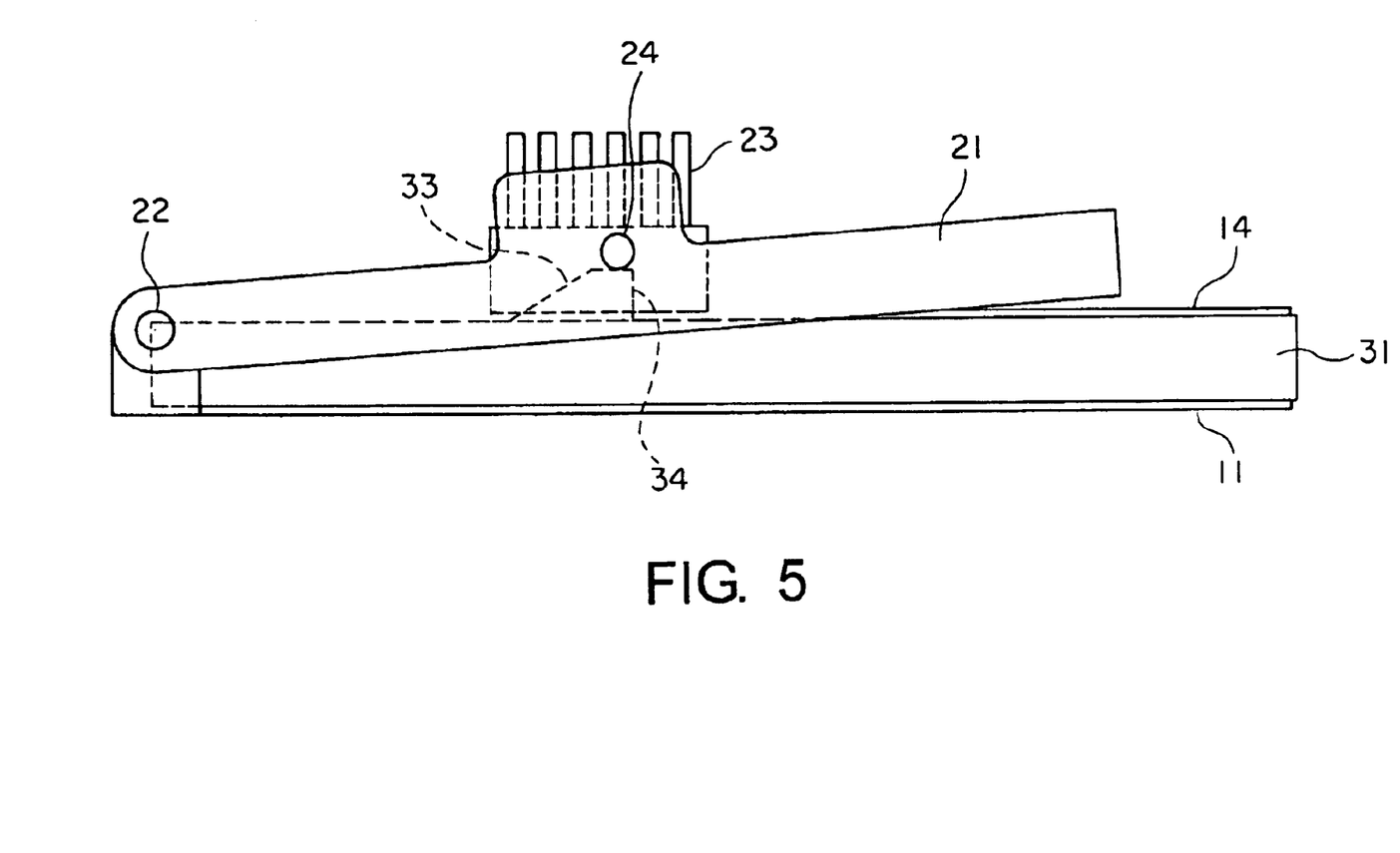
FIG. 5 is an enlarged side view of the card connector in the state of FIG. 4.
Figure 6:
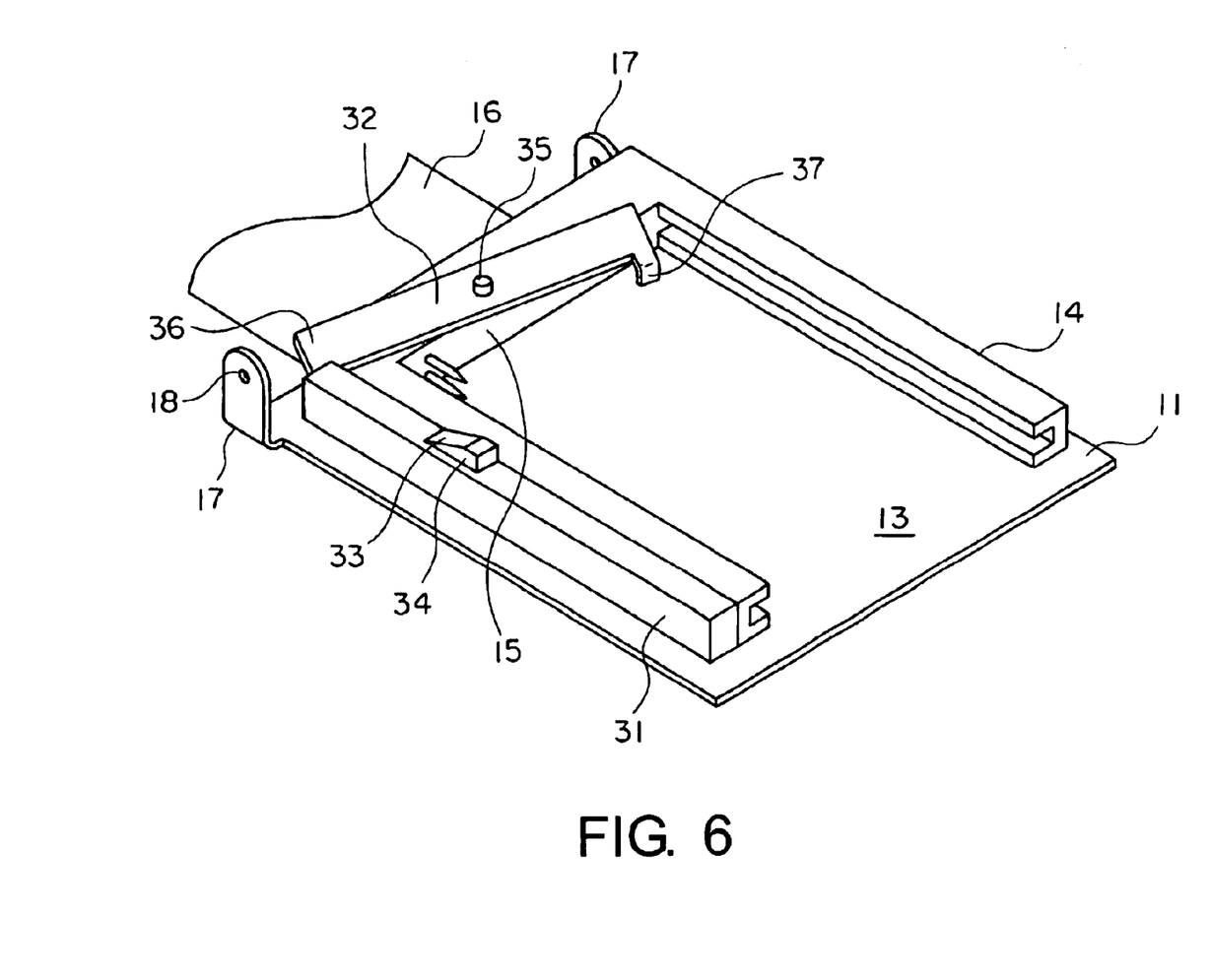
FIG. 6 is a perspective view of the card connector in the state of FIG. 4 with some components are omitted in order to clearly show the internal state.
Figure 7:
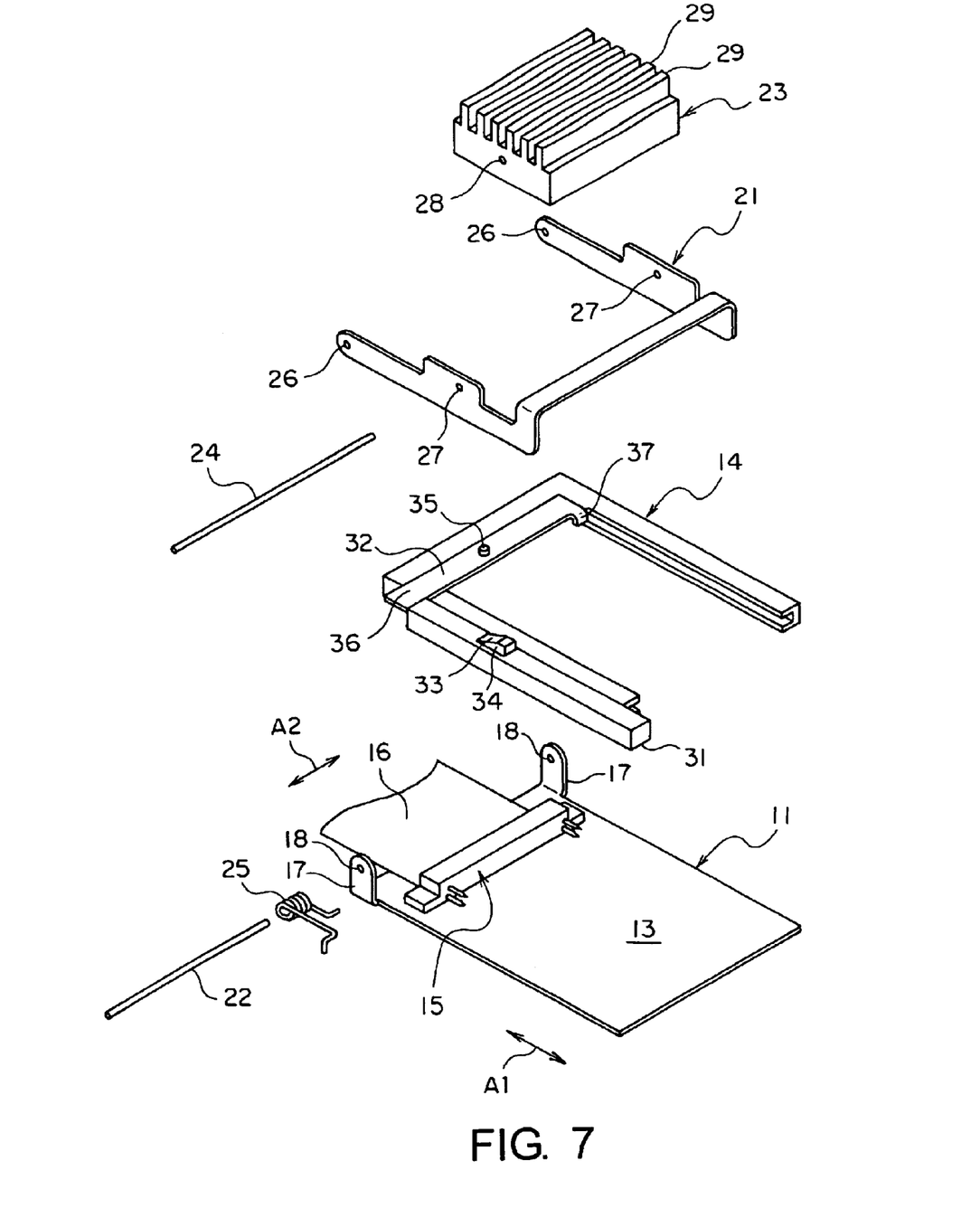
FIG. 7 is an exploded perspective view of the card connector illustrated in FIGS. 1 and 4.

On the other hand, when the eject bar 31 is pushed and moved rearward by a finger or the like in the state where the card 12 is inserted at the predetermined position, the first end 36 is pushed by the rear end of the eject bar 31 to rotate the lever 32 around the support point 35 in a clockwise direction. At this time, the second end 37 of the lever 32 pushes the card 12 forward. In advance, the cam surface 34 is moved to a position faced to the second shaft 24 to lift the second shaft 24. As the second shaft 24 is lifted upward, the heat sink 23 is separated from the card 12. Thereafter, the second end 37 of the lever 32 pushes and moves the card 12 forward. At this time, the heat sink 23 is separated from the card 12 so that removal of the card 12 is not inhibited. Thus, when the card 12 is removed from the predetermined position, the heat sink 23 is separated from the card 12 by the action of the cam mechanism before the card 12 is removed.

Alternatively, the holding member is provided with a cam surface while the eject mechanism has a cam follower.

Figure 8:
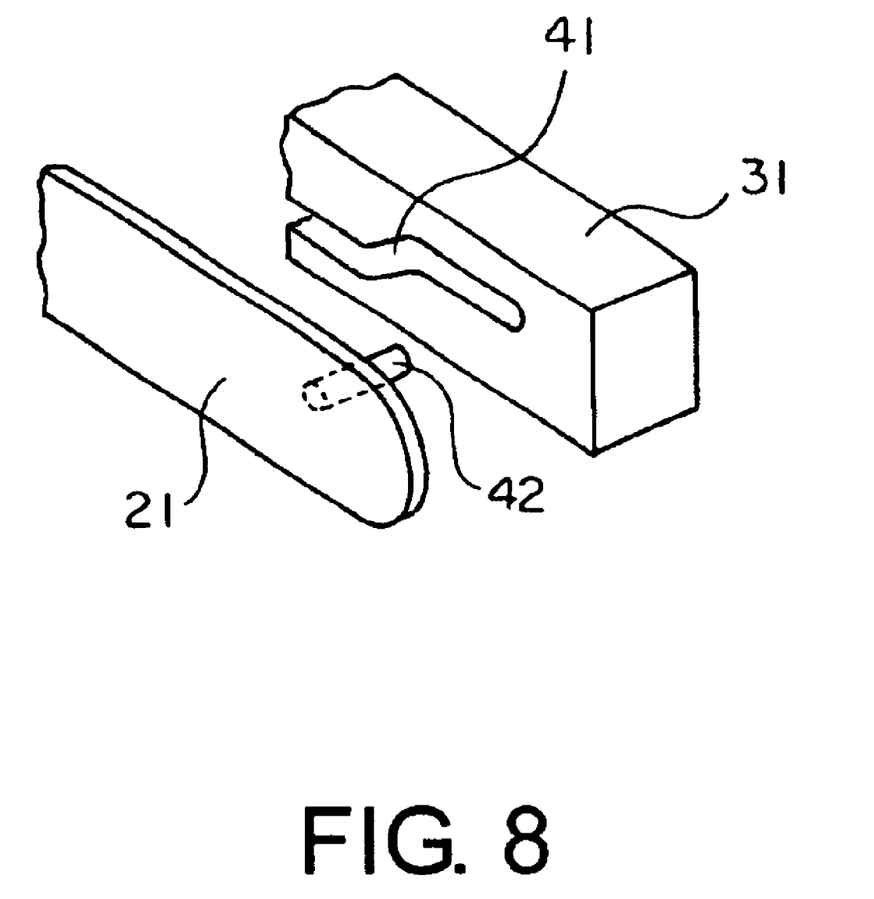
FIG. 8 is a perspective view of a characteristic part of a modification of the card connector in FIGS. 1 and 4.

Referring to FIG. 8, the eject bar 31 is provided with a cam groove 41. The arm 21 has, as a cam follower, a pin 42 formed at a corresponding portion of the arm 21 and inserted into and engaged with the cam groove 41. With this structure also, the above-mentioned cam mechanism can be formed by the cam groove 41 and the pin 42.

Alternatively, the arm 21 is provided with a cam groove while the eject bar 31 has, as a cam follower, a pin inserted into the cam groove.

The card connector of the type described is usable for connection of a card used in a POD module or the like and recording personal information or various other types of card-like electronic elements such as an IC card.

While this invention has thus far been described in conjunction with the preferred embodiment thereof, it will be readily possible for those skilled in the art to put this invention into practice in various other manners without departing from the scope set forth in the appended claims.

What is claimed is:

1. A card connector to be connected to a card inserted at a predetermined position, said card connector comprising:
    an eject mechanism for removing said card;
    a heat radiation member for promoting heat radiation of said card;
    a holding member holding said heat radiation member so that said heat radiation member is movable with respect to said card; and
    a cam mechanism acting between said eject mechanism and said holding member, said heat radiation member being brought into contact with said card when said card is inserted to said predetermined position, said card being removed from said predetermined position after said heat radiation member is separated from said card by the action of said cam mechanism, wherein said cam mechanism comprises:
    a cam surface formed on one of said eject mechanism and said holding member; and
    a cam follower formed on the other of said eject mechanism and said holding member to be engaged with said cam surface following a movement of said eject mechanism.

2. The card connector according to claim 1, further comprising urging means for urging said heat radiation member towards said card.

3. The card connector according to claim 1, wherein said heat radiation member is rotatably held by said holding member.

4. A card connector to be connected to a card inserted at a predetermined position, said card connector comprising:
    an eject mechanism for removing said card;
    a heat radiation member for promoting heat radiation of said card;
    a holding member holding said heat radiation member so that said heat radiation member is movable with respect to said card; and
    a cam mechanism acting between said eject mechanism and said holding member, said heat radiation member being brought into contact with said card when said card is inserted to said predetermined position, said card being removed from said predetermined position after said heat radiation member is separated from said card by the action of said cam mechanism,
    wherein said cam mechanism comprises:
    a cam groove formed on one of said eject mechanism and said holding member; and a cam follower formed on the other of said eject mechanism and said holding member to move along said cam groove in following a movement of said eject mechanism.

5. The card connector according to claim 4, further comprising urging means for urging said heat radiation member towards said card.

6. The card connector according to claim 4, wherein said heat radiation member is rotatably held by said holding member.

7. A card connector to be connected to a card inserted at a predetermined position, said card connector comprising:

an eject mechanism for removing said card;

a heat radiation member for promoting heat radiation of said card;

a holding member holding said heat radiation member so that said card;

a holding member holding said heat radiation member so that said heat radiation member is movable with respect to said card;

a cam mechanism acting between said eject mechanism and said holding member, said heat radiation member being brought into contact with said card when said card is inserted to said predetermined position, said card being removed from said predetermined position after said heat radiation member is separated from said card by the action of said cam mechanism;

a card guide for guiding insertion and removal of said card; and a base plate to which said card guide is fixed, said holding member having an arm rotatably connected to said base plate and a shaft held by a rotating end of said arm, said heat radiation member being rotatably held by said shaft.

8. The card connector according to claim 7, wherein said eject mechanism comprises:

an eject bar slidable along said card guide; and a lever following a movement of said eject bar to transmit removing force of said card.

9. The card connector according to claim 7, further comprising a connector element to be connected to said card inserted at said predetermined position.

10. The card connector according to claim 7, further comprising urging means for urging said heat radiation member towards said card.

11. The card connector according to claim 7, wherein said heat radiation member is rotatably held by said holding member.

12. The card connector according to claim 7, wherein said cam mechanism comprises:

a cam formed on one of said eject mechanism and said holding member; and a cam follower formed on the other of said eject mechanism and said holding member to move along said cam in following a movement of said eject mechanism, said shaft serving as said cam follower.

13. The card connector according to claim 12, wherein said shaft extends perpendicular to a direction of insertion or removal of said card.

* * * * *